United States Patent
Harada et al.

(10) Patent No.: US 6,426,258 B1
(45) Date of Patent: Jul. 30, 2002

(54) METHOD OF MANUFACTURING A SEMICONDUCTOR INTEGRATED CIRCUIT DEVICE

(75) Inventors: Hirofumi Harada; Jun Osanai, both of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/219,997

(22) Filed: Dec. 23, 1998

(30) Foreign Application Priority Data

Dec. 24, 1997 (JP) ............................................. 9-355540

(51) Int. Cl.$^7$ ............................................ H01L 21/336
(52) U.S. Cl. .................. 438/268; 438/282; 438/302
(58) Field of Search ............................... 438/268, 276, 438/282, 289, 291, 252, 302

(56) References Cited

U.S. PATENT DOCUMENTS

| | | | | |
|---|---|---|---|---|
| 4,417,385 A | * | 11/1983 | Temple | 438/268 |
| 5,270,227 A | * | 12/1993 | Kameyama et al. | 437/35 |
| 5,409,848 A | * | 4/1995 | Han et al. | 437/35 |
| 5,508,217 A | * | 4/1996 | Sawada | 438/138 |
| 5,538,909 A | * | 7/1996 | Hsu | 437/35 |
| 5,650,347 A | * | 7/1997 | Choi | 437/44 |
| 5,712,814 A | * | 1/1998 | Fratin et al. | 365/182 |
| 5,731,611 A | * | 3/1998 | Hshieh et al. | 257/341 |
| 5,830,788 A | * | 11/1998 | Hiroki et al. | 438/199 |
| 5,885,886 A | * | 3/1999 | Lee | 438/528 |
| 5,915,185 A | * | 6/1999 | Fratin et al. | 438/302 |
| 5,920,776 A | * | 7/1999 | Fratin et al. | 438/257 |
| 5,933,733 A | * | 8/1999 | Ferla et al. | 438/268 |
| 6,078,081 A | * | 6/2000 | Lee | 257/344 |
| 6,083,794 A | * | 7/2000 | Hook et al. | 438/286 |

* cited by examiner

Primary Examiner—Michael Trinh
(74) Attorney, Agent, or Firm—Adams & Wilks

(57) ABSTRACT

A method of manufacturing a semiconductor integrated circuit device comprises forming a gate insulating film on a surface of a semiconductor substrate of a first conductivity type, forming a polycrystal silicon film on the gate insulating film, etching the polycrystal silicon film to form a gate electrode on a portion of the gate insulating film, etching the gate insulating film except at the portion thereof where the gate electrode has been formed, and forming a thermal oxide film on the semiconductor substrate at regions corresponding to the etched gate insulating film. Impurities of a second conductivity type are implanted into a source region in the semiconductor substrate through the thermal oxide film to form a body region of the second conductivity type. The semiconductor substrate is then heated at a temperature of 1000° C. or higher. Impurities of the first conductivity type are then implanted into the body region at an inclination angle equal to or greater than 7° with respect to a line perpendicular to the surface of the semiconductor substrate so that the impurities of the first conductivity type are implanted to a depth from the surface of the semiconductor substrate which is less than a depth of the source region from the surface of the semiconductor substrate.

6 Claims, 8 Drawing Sheets

PRIOR ART

METHOD OF MANUFACTURING A SEMICONDUCTOR INTEGRATED CIRCUIT DEVICE

BACKGROUND OF THE INVENTION

The present invention relates to a double diffusion insulated gate field effect transistor (DMOS) and a semiconductor integrated circuit device including the DMOS.

FIG. 2 is a cross-sectional view showing processes in a conventional manufacturing method for manufacturing a double diffusion insulated gate field effect transistor (hereinafter referred to as "DMOS") used in a semiconductor integrated circuit device. As an example, an n-channel lateral double diffusion insulated gate field effect transistor (hereinafter referred to as "LDMOS") will be described. First, after a gate insulating film 3 for forming an LDMOS and a field insulating film 2 for element separation are formed on an n-type semiconductor substrate 1 (FIG. 2(a)), impurities of the same conductivity as that of the above-described semiconductor substrate, for example, arsenic is implanted (channel doped) in a region of the gate insulating film 3 where the LDMOS is formed in order to adjust a threshold voltage of the LDMOS (FIG. 2(b)). An angle at which the impurities are implanted is generally inclined by about 7° from a direction perpendicular to the substrate in order to prevent a channeling phenomenon.

Then, a polycrystal silicon film is deposited through LPCVD. In order that the polycrystal silicon is used as a gate electrode of the LDMOS, the polycrystal silicon film is formed in the thickness of 2000 to 4000 Å. Subsequently, in order that the polycrystal silicon is used as a low-resistant electrode, impurities are implanted in the polycrystal silicon film with a high concentration through thermal diffusion at 890° C. The impurities are made of phosphorus, the concentration of impurity is $10^{20}$ atoms/cm$^3$ or more, and the resistant value of the polycrystal silicon film per unit length and unit width, that is, a sheet resistance is a low resistance such as 100 Ω/□ or less. Then, the polycrystal silicon is patterned in the form of a gate electrode 4 (FIG. 2(c)).

Thereafter, the gate insulating film 3 on the semiconductor substrate surface is etched by an etchant such as HF. In this situation, the field insulating film 2 is etched as thick as that of the gate insulating film so as to be reduced in thickness, and the gate insulating film is etched in a region where the gate insulating film is formed but no gate electrode is formed to expose the semiconductor substrate 1. Then, a thermal oxide film 10 is formed through thermal oxidation in thickness of 100 to 300 Å in the region where the semiconductor substrate 1 is exposed. Subsequently, in order to form a body region 7 of the LDMOS, impurities of the conductivity opposite to that of the semiconductor substrate, for example, boron is implanted into a region that will form a source of the LDMOS in a self-alignment manner using a photo-resist 9 and the gate electrode 4 as a mask (FIG. 2(d)).

Then, in order to make the impurities in the body region diffuse, a heat treatment is conducted (FIG. 2(e)). The heat treatment is conducted at a high temperature of 1000° C. or higher in order to make the impurities for the body diffuse up to desired distances in a depthwise direction and a lateral direction of the semiconductor substrate. In this situation, the channel doping impurities which have been implanted in a previous step are diffused at the same time.

Subsequently, impurities, for example, arsenic is implanted in source/drain regions 5 and 6 of the LDMOS through ion implantation (FIG. 2(f)). The concentration of impurities is high to the degree of $10^{20}$ atoms/cm$^3$ or more. Thereafter, although not shown, an intermediate insulating film is formed on the semiconductor substrate. Contact holes are formed on the substrate where the source and the drain have been formed. Then, metal wirings are formed for electrically connecting the respective parts of the circuit. The metal wirings are generally formed of aluminum wirings.

However, the conventional method suffers from problems stated below.

Because the heat treatment is conducted for diffusion in the body region after the channel doping process, the heat treatment causes the concentration of the impurities with which the channel doping has been made on the semiconductor substrate surface to be lowered. This makes it impossible to lower the threshold voltage of the DMOS. Also, when the dope amount of impurities for channel doping increases in order to lower the threshold voltage, the channel doping impurities are caused to diffuse up to the deep portion of the substrate. Then, the impurities in the body region whose conductivity is opposite to that of the channel doping impurities are negated by the channel doping impurities in the deep portion of the substrate, resulting in such phenomenons that the effective concentration of impurities in the body is lowered, and the channel length is shortened. Also, the impurity concentration in a region except for the body region under the gate electrode becomes high. As a result, a source/drain withstand voltage is deteriorated due to punch-through.

For that reason, the impurity dose of the channel doping must be reduced in order to prevent the withstand voltage from being deteriorated, and therefore the threshold voltage cannot be set to be low.

Under the above circumstances, in order to solve the above problems with the conventional device, an object of the present invention is to prevent the deterioration of the source/drain withstand voltage due to the punch-through which is caused by the channel doping process, and to realize a low threshold voltage.

SUMMARY OF THE INVENTION

In order to solve the above problems, a method of manufacturing a semiconductor integrated circuit device according the present invention is characterized by comprising: a step of forming a gate insulating film on a semiconductor substrate of a first conductive type; a step of forming a polycrystal silicon film of 2000 to 4000 Å on the gate insulating film; a step of implanting impurities $10^{20}$ atoms/cm$^3$ or more in concentration into the polycrystal silicon film; a step of etching the polycrystal silicon film to form a gate electrode; a step of etching the gate insulating film where no gate electrode has been formed; a step of forming a thermal oxide film of 100 to 300 Å on the semiconductor substrate where the gate insulating film has been etched; a step of implanting impurities of a second conductive type which will form a body region into a source region of a double diffusion insulated gate field effect transistor in the semiconductor substrate on which the thermal oxide film has been formed; a step of conducting a heat treatment on the semiconductor substrate at a temperature of 1000° C. or higher; a step of implanting the impurities of the first conductive type into the body region of the second conductive type with an inclination exceeding 7°, in a direction of from the drain region toward the source region on the same element, with respect to a direction perpendicular to the semiconductor substrate; a step of implanting the impurities of the first conductive type into the source/drain regions of the double diffusion insulated gate field effect transistor; a step of forming an intermediate insulating film on the thermal oxide film and the polycrystal silicon; a step of forming contact holes in the intermediate insulating film; and a step of providing metal wirings in the contact holes.

Also, a method of manufacturing a semiconductor integrated circuit device according to the present invention is characterized by comprising: a step of forming a gate insulating film on a semiconductor substrate of a first conductive type; a step of forming a polycrystal silicon film of 2000 to 4000 Å on the gate insulating film; a step of implanting impurities $10^{20}$ atoms/cm$^3$ or more in concentration into the polycrystal silicon film; a step of etching the polycrystal silicon film to form a gate electrode; a step of etching the gate insulating film where no gate electrode has been formed; a step of forming a thermal oxide film of 100 to 300 Å on the semiconductor substrate where the gate insulating film has been etched; a step of implanting impurities of a second conductive type which will form a body region into a source region of a double diffusion insulated gate field effect transistor in the semiconductor substrate on which the thermal oxide film has been formed; a step of conducting a heat treatment on the semiconductor substrate at a temperature of 1000° C. or higher; a step of implanting the impurities of the first conductive type into the body region of the second conductive type with an inclination exceeding 7° with respect to a direction perpendicular to the semiconductor substrate while rotating the semiconductor substrate in a planar direction; a step of implanting the impurities of the first conductive type into the source/drain regions of the double diffusion insulated gate field effect transistor; a step of forming an intermediate insulating film on the thermal oxide film and the polycrystal silicon; a step of forming contact holes in the intermediate insulating film; and a step of providing metal wirings in the contact holes.

Further, a method of manufacturing a semiconductor integrated circuit device according to the present invention is characterized by comprising: a step of forming a gate insulating film on a semiconductor substrate of an n-type; a step of forming a polycrystal silicon film of 2000 to 4000 Å on the gate insulating film; a step of implanting impurities $10^{20}$ atoms/cm$^3$ or more in concentration into the polycrystal silicon film; a step of etching the polycrystal silicon film to form a gate electrode; a step of etching the gate insulating film where no gate electrode has been formed; a step of forming a thermal oxide film of 100 to 300 Å on the semiconductor substrate where the gate insulating film has been etched; a step of implanting impurities of a p-type which will form a body region into a source region of a double diffusion insulated gate field effect transistor in the semiconductor substrate on which the thermal oxide film has been formed; a step of conducting a heat treatment on the semiconductor substrate at a temperature of 1000° C. or higher; a step of implanting phosphorus into the body region of the p-type at an angle of from 45° to 60° with respect to a direction perpendicular to the semiconductor substrate with an implantation energy of from 70 keV to 180 keV while rotating the semiconductor substrate in a planar direction; a step of implanting the impurities of the n-type into the source/drain regions of the double diffusion insulated gate field effect transistor; a step of forming an intermediate insulating film on the thermal oxide film and the polycrystal silicon; a step of forming contact holes in the intermediate insulating film; and a step of providing metal wirings in the contact holes.

Further, a method of manufacturing a semiconductor integrated circuit device according to the present invention is characterized by comprising: a step of forming a gate insulating film on a semiconductor substrate of an n-type; a step of forming a polycrystal silicon film of 2000 to 4000 Å on the gate insulating film; a step of implanting impurities $10^{20}$ atoms/cm$^3$ or more in concentration into the polycrystal silicon film; a step of etching the polycrystal silicon film to form a gate electrode; a step of etching the gate insulating film where no gate electrode has been formed; a step of forming a thermal oxide film of 100 to 300 Å on the semiconductor substrate where the gate insulating film has been etched; a step of implanting impurities of a p-type which will form a body region into a source region of a double diffusion insulated gate field effect transistor in the semiconductor substrate on which the thermal oxide film has been formed; a step of conducting a heat treatment on the semiconductor substrate at a temperature of 1000° C. or higher; a step of implanting arsenic into the body region of the p-type at an angle of from 40° to 60° with respect to a direction perpendicular to the semiconductor substrate with an implantation energy of from 120 keV to 180 keV while rotating the semiconductor substrate in a planar direction; a step of implanting the impurities of the n-type into the source/drain regions of the double diffusion insulated gate field effect transistor; a step of forming an intermediate insulating film on the thermal oxide film and the polycrystal silicon; a step of forming contact holes in the intermediate insulating film; and a step of providing metal wirings in the contact holes.

Further, a method of manufacturing a semiconductor integrated circuit device according to the present invention is characterized by comprising: a step of forming a gate insulating film on a semiconductor substrate of a p-type; a step of forming a polycrystal silicon film of 2000 to 4000 Å on the gate insulating film; a step of implanting impurities $10^{20}$ atoms/cm$^3$ or more in concentration into the polycrystal silicon film; a step of etching the polycrystal silicon film to form a gate electrode; a step of etching the gate insulating film where no gate electrode has been formed; a step of forming a thermal oxide film of 100 to 300 Å on the semiconductor substrate where the gate insulating film has been etched; a step of implanting impurities of an n-type which will form a body region into a source region of a double diffusion insulated gate field effect transistor in the semiconductor substrate on which the thermal oxide film has been formed; a step of conducting a heat treatment on the semiconductor substrate at a temperature of 1000° C. or higher; a step of implanting boron into the body region of the n-type at an angle of from 45° to 60° with respect to a direction perpendicular to the semiconductor substrate with an implantation energy of from 40 keV to 180 keV while rotating the semiconductor substrate in a planar direction; a step of implanting the impurities of the p-type into the source/drain regions of the double diffusion insulated gate field effect transistor; a step of forming an intermediate insulating film on the thermal oxide film and the polycrystal silicon; a step of forming contact holes in the intermediate insulating film; and a step of providing metal wirings in the contact holes.

Further, a method of manufacturing a semiconductor integrated circuit device according to the present invention is characterized by comprising: a step of forming a gate insulating film on a semiconductor substrate of a p-type; a step of forming a polycrystal silicon film of 2000 to 4000 Å on the gate insulating film; a step of implanting impurities $10^{20}$ atoms/cm$^3$ or more in concentration into the polycrystal silicon film; a step of etching the polycrystal silicon film to form a gate electrode; a step of etching the gate insulating film where no gate electrode has been formed; a step of forming a thermal oxide film of 100 to 300 Å on the semiconductor substrate where the gate insulating film has been etched; a step of implanting impurities of an n-type which will form a body region into a source region of a double diffusion insulated gate field effect transistor in the semiconductor substrate on which the thermal oxide film has been formed; a step of conducting a heat treatment on the semiconductor substrate at a temperature of 1000° C. or higher; a step of implanting $BF_2$ into the body region of the n-type at an angle of from 40° to 60° with respect to a direction perpendicular to the semiconductor substrate with an implantation energy of from 100 keV to 180 keV while rotating the semiconductor substrate in a planar direction; a step of implanting the impurities of the p-type into the source/drain regions of the double diffusion insulated gate field effect transistor; a step of forming an intermediate insulating film on the thermal oxide film and the polycrystal silicon; a step of forming contact holes in the intermediate insulating film; and a step of providing metal wirings in the contact holes.

DETAILED DESCRIPTION OF THE PREFERRED EMBODIMENTS

Hereinafter, embodiments of the present invention will be described with reference to drawings.

Figure 1:
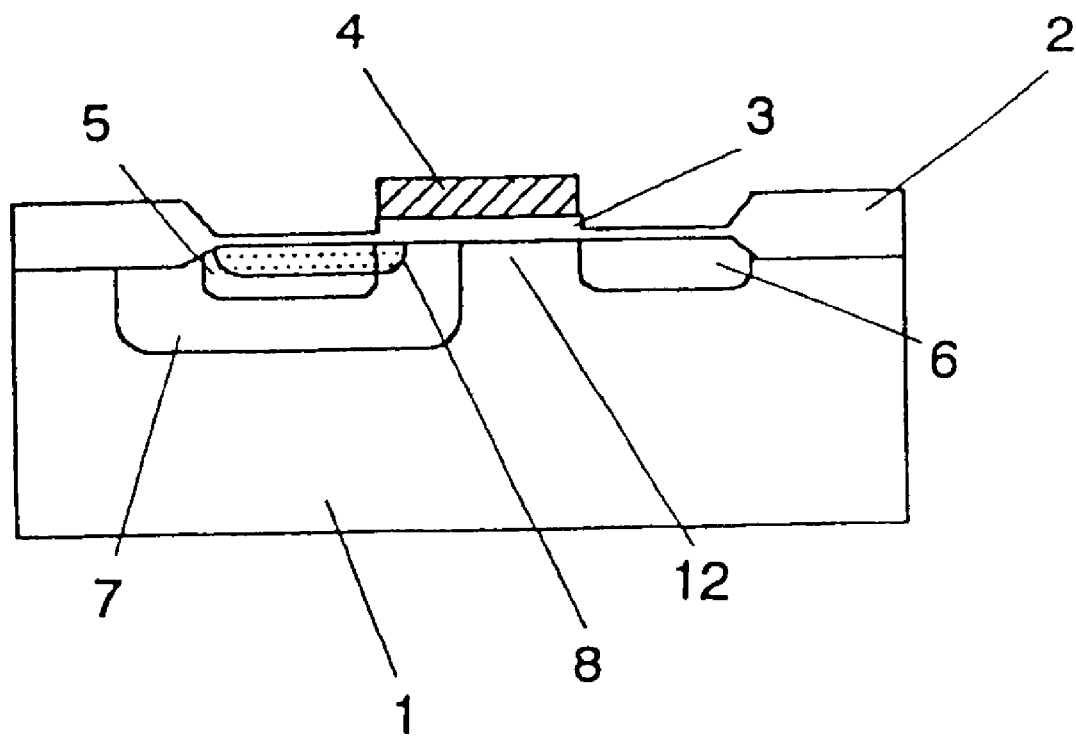
FIG. 1 is a cross-sectional view of a lateral type double diffusion insulated gate field effect transistor in accordance with the present invention.

FIG. 1 is a cross-sectional view of an LDMOS used in a semiconductor integrated circuit device which has been subjected to a manufacturing process of the present invention.

Also, FIG. 3 is a cross-sectional view of a manufacturing process of the present invention for manufacturing the LDMOS used in the semiconductor integrated circuit device. Hereinafter, the manufacturing method according to the present invention will be described with an example of an n-channel LDMOS with reference to FIG. 3.

Figure 3A:
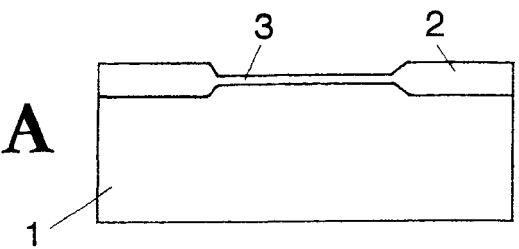
FIG. 3 is a cross-sectional view showing processes in a method for manufacturing a double diffusion insulated gate field effect transistor in accordance with the present invention.
Figure 3B:
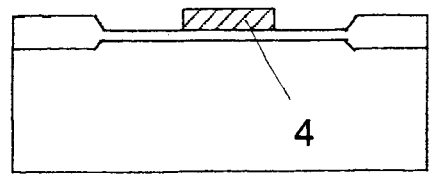
Figure 3C:
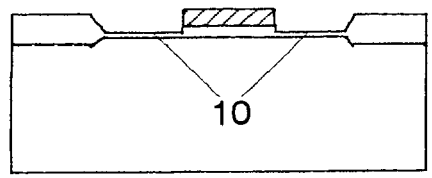

First, a gate insulating film 3 for forming an LDMOS and a field insulating film 2 for element separation are formed on an n-type semiconductor substrate 1 (FIG. 3(a)).

Then, a polycrystal silicon film is deposited through LPCVD. In order that the polycrystal silicon is used as a gate electrode of the LDMOS, it is formed in the thickness of 2000 to 4000 Å. Subsequently, in order that the polycrystal silicon is formed into a low-resistant electrode, impurities are implanted with a high concentration in the polycrystal silicon film through thermal diffusion at 890° C. The impurities are made of phosphorus, the concentration of impurity is $10^{20}$ atoms/cm$^3$ or more, and the resistant value of the polycrystal silicon film per unit length and unit width, that is, a sheet resistance is set at a low resistance such as 100 Ω/□ or less. Then, the polycrystal silicon is patterned in the form of a gate electrode 4 (FIG. 3(b)).

Thereafter, the gate insulating film on the semiconductor substrate surface is etched by an etchant such as HF. In this situation, the field insulating film 2 is etched as thick as that of the gate insulating film so as to be reduced in thickness, and the gate insulating film is etched in a region where the gate insulating film is formed but no gate electrode is formed to expose the semiconductor substrate 1. Then, a thermal oxide film 10 is formed in thickness of 100 to 300 Å in the region where the semiconductor substrate 1 is exposed through thermal oxidation (FIG. 3(c)).

Figure 3D:
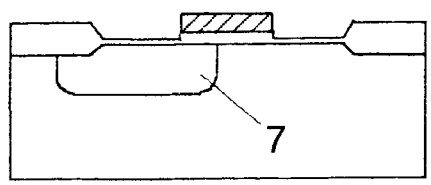
Figure 3E:
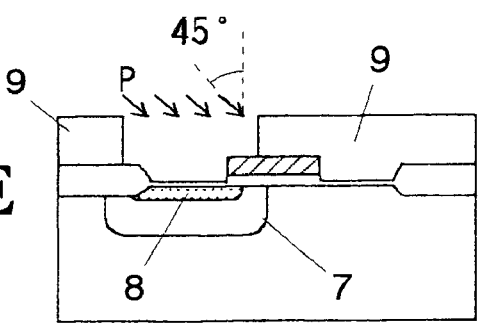

Subsequently, in order to form a body region 7 of the LDMOS, impurities of the conductivity opposite to that of the semiconductor substrate, for example, boron is implanted into a region that will form a source of the LDMOS in a self-alignment manner using a photo-resist 9 and the gate electrode 4 as a mask, and a heat treatment is then conducted in order to make the impurities in the body region diffuse (FIG. 3(d)). The dose of impurities is 1E12/cm$^2$ or more, and the heat treatment is conducted at a high temperature of 1000° C. or higher in order to make the impurities for the body diffuse up to desired distances in a depthwise direction and a lateral direction of the semiconductor substrate.

Subsequently, channel doping is conducted in order to adjust the threshold voltage of the LDMOS. The impurities to be implanted is selected from impurities of the conductive type which is opposite to that of the body, that is, which is the same as that of the above-described semiconductor substrate so that the effect of the impurities in the body where concentration thereof is high is negated. Then, the impurities are implanted in the body region while an angle of implantation is inclined in order to lower the threshold voltage. For example, phosphorus is implanted using the photo-resist 9 and the gate electrode 4 as a mask in a self-alignment manner (FIG. 3(e)).

An angle at which the impurities are implanted is generally inclined by about 7° from a direction perpendicular to the substrate in order to prevent a channeling phenomenon. However, since the gate electrode has been already formed, and the channel region of the LDMOS is covered with the gate electrode, no impurities are implanted into the channel region at such an angle. Therefore, in the present invention, there is employed a method in which an angle at which impurities are implanted is inclined at an angle larger than the usual angle toward the source region from the drain region on the same element with respect to a direction perpendicular to the substrate surface so that the impurities are obliquely implanted in the channel region under the gate electrode. Although the implantation angle depends on the thickness of the gate insulating film, the type of dose, etc., phosphorus is implanted at an angle of 60° in this example. Also, although the dose depends on the concentration in the body region and a desired threshold voltage, for example, in the case where the dose in the body region is $1\times10^{14}$ atoms/cm$^2$, the dose on the order of $10^{12}$ atoms/cm$^2$ or more is required. This is realized by not inclining the beam of ion implantation but inclining a wafer relative to the ion beam in the device.

Figure 3F:
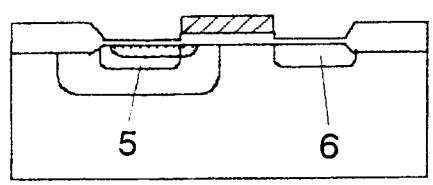

Then, impurities, for example, arsenic is implanted in the source/drain regions of the LDMOS by ion implantation (FIG. 3(f)). The concentration of impurities is set at a high concentration of $10^{20}$ atoms/cm$^3$ or more. Thereafter, although not shown, an intermediate insulating film is formed on the semiconductor substrate, and contact holes are formed in the substrate on which the source, the drain, etc., have been formed. Thereafter, metal wirings are formed for electrically connecting the respective parts of the circuit. The metal wirings are generally formed of aluminum wirings.

In the LDMOS manufactured through the above process, the body region on the semiconductor substrate surface under the gate electrode forms a channel region. The channel length that determines the significant characteristic of the LDMOS is nearly defined by the diffusion length that is extended during the above-described heat treatment on the body region.

Figure 2A:
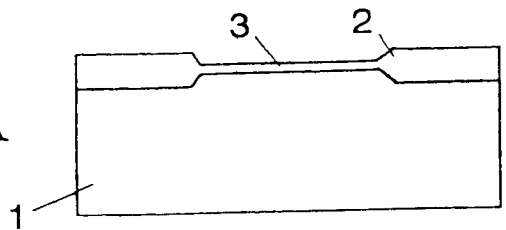
FIG. 2 is a cross-sectional view showing processes in a conventional method for manufacturing a double diffusion insulated gate field effect transistor.
Figure 2B:
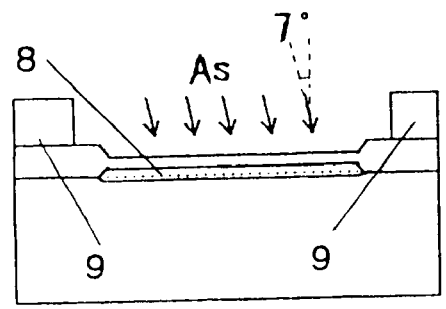
Figure 2C:
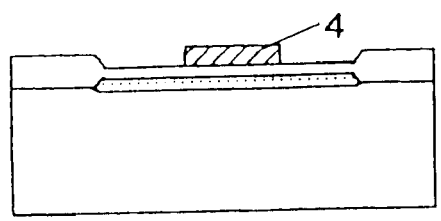
Figure 2D:
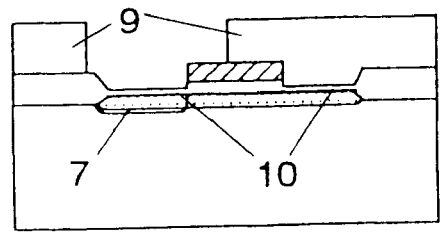
Figure 2E:
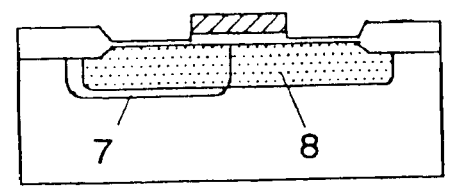
Figure 2F:
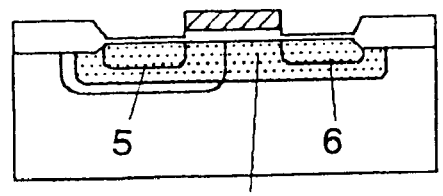

A heat treatment that requires the largest heat quantity in processes subsequent to the formation of the gate insulating film is this heat treatment for diffusing the impurities in the body region, which is conducted at a temperature of from 1000 to 1150° C. for a period of time ranging from 30 to 240 minutes, although depending on a desired characteristic of the DMOS. In the conventional manufacturing method, since the channel doping process is conducted prior to this heat treatment, the impurities implanted by channel doping diffuse up to the deep portion of the substrate over the entire element region through that heat treatment. As a result, as shown in FIG. 2(f), the profile of impurities under the gate electrode is caused to change up to the very deep portion thereof. That is, the concentration in the body region under the gate electrode is negated by the influence of the channel doping impurities opposite in conductivity to the body region so that the concentration becomes low. On the other hand, the concentration in a drift region 12 other than the body region under the gate electrode is made high by the influence of the channel doping impurities identical in conductivity with the drift region. This phenomenon is more remarkable as the dose implanted during the channel doping process is large, and the characteristic of the element except for the threshold voltage is changed more when compared with the case where no channel doping process is conducted.

Figure 4:
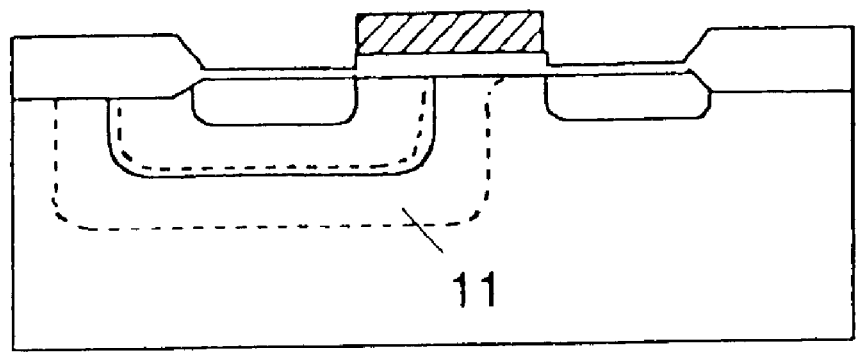
FIG. 4 is a schematic cross-sectional view showing a lateral type double diffusion insulated gate field effect transistor manufactured in a manufacturing method from which a channel doping process has been deleted.

FIG. 4 is a final sectional structure of the device in the case where no channel doping process has been conducted. The figure schematically shows an appearance of a depletion layer 11 between the drain and the body which is caused when a positive voltage is applied to the drain, and 0 V is applied to another terminal.

Figure 5:
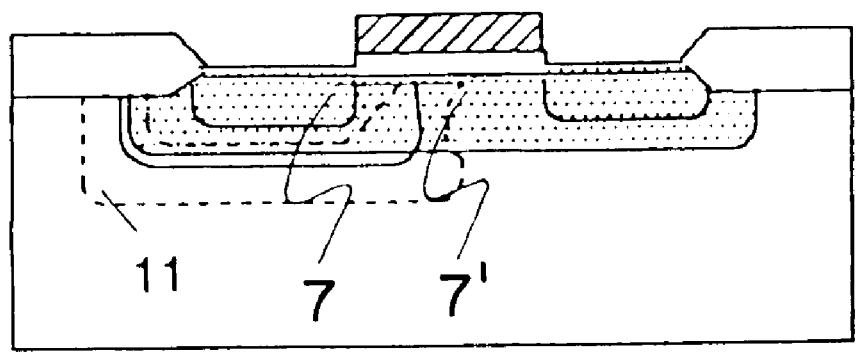
FIG. 5 is a schematic cross-sectional view showing a lateral type double diffusion insulated gate field effect transistor manufactured by the conventional manufacturing method.

On the contrary, FIG. 5 schematically shows an appearance of a depletion layer 11 between the drain and the body which is caused when a positive voltage is applied to the drain, and 0 V is applied to another terminal in the conventional method shown in FIG. 2(f). The addition of the channel doping process makes the profile of impurities in the body region and the appearance of the depletion layer change as shown in the figure. Two characteristic matters are stated below.

First, in the conventional method, because the channel doping impurities are implanted into the entire element region and then diffused, the impurities in the body region are negated, as a result of which the extension of the body region is shortened. Also, as described above, the concentration in the body region is thinned due to the channel doping impurities whereas the concentration in the drift region is thickened, with the result that the depletion layer between the drain and body is liable to extend toward the body side. For that reason, the punch-through is liable to occur, resulting in the lowered withstand voltage.

Secondly, because the concentration of channel doping impurities on the gate insulating film interface is thinned by conducting a heat treatment on the body region after the channel doping process, a change in the threshold voltage of the DMOS accompanying with an increase in the dose amount of channel doping is gradual, and the remarkably large dose is required for obtaining a low threshold voltage. However, this promotes the abovementioned deterioration of the punch-through withstand voltage.

For that reason, in order to hold the punch-through withstand voltage at a given voltage or higher, the threshold voltage must be set at a high value, making it difficult to lower the voltage across the element.

Figure 6:
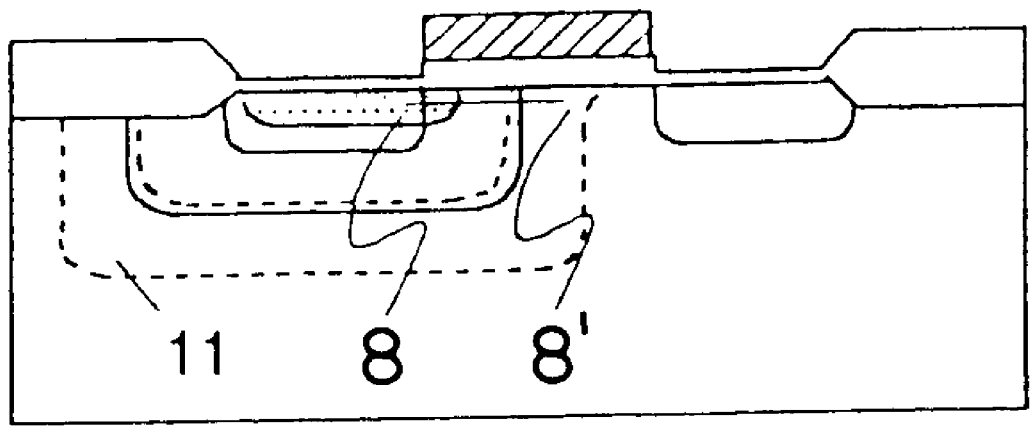
FIG. 6 is a schematic cross-sectional view showing a lateral type double diffusion insulated gate field effect transistor manufactured by the manufacturing method according to the present invention.

By contrast, according to the present invention, since the channel doping process is conducted after the heat treatment is conducted on the impurities in the body region, the concentration of the gate insulating film interface can be held high without any diffusion of the channel doping impurities up to the deep portion of the substrate as in the conventional method, even if the same dose as the conventional one is used, it is possible to lower the threshold voltage. In addition, since the channel doping impurities are formed only in the vicinity of the gate insulating film in the body region so as not to be implanted into the above-described drift region, there is no case in which the profile of the concentration of impurities between the drain and the body in the deep portion of the substrate is changed such that it influence s the punch-through. Accordingly, the appearance of the depletion layer 11 under the same electrical conditions as those of FIGS. 4 and 5 is schematically shown in FIG. 6 and becomes identical with the appearance of the depletion layer 11 in case of the manufacturing method from which the channel doping process has been omitted as shown in FIG. 4. For that reason, even if the dose amount of channel doping is made high, there is no case in which the punch-through withstand voltage is lowered.

In other words, since the punch-through withstand voltage can be held at a given voltage or higher, the threshold voltage to be obtained can be set at a lower value than that in the conventional method, thereby being capable of providing a semiconductor integrated circuit lower in voltage than the conventional circuit.

In the conventional manufacturing method, impurities can be implanted over the entire surface in the body region under the gate electrode which forms a channel by implanting the channel doping impurities. On the other hand, in the method of the present invention, in order to implant the impurities over the entire surface in the body region under the gate electrode which forms a channel, there are required that an angle at which the impurities are implanted is made large, and that the implantation energy is made larger than the conventional one.

However, among the impurities in the channel, one greatly influences the threshold voltage of the DMOS is a high-concentration region at the source side among the regions in the body region under the gate electrode. Accordingly, the threshold voltage can be lowered by concentrating the channel doping impurities in that region. For that reason, there is no need to set the implantation energy to be high to the degree that it reaches the entire surface of the body region under the gate electrode.

Figure 7:
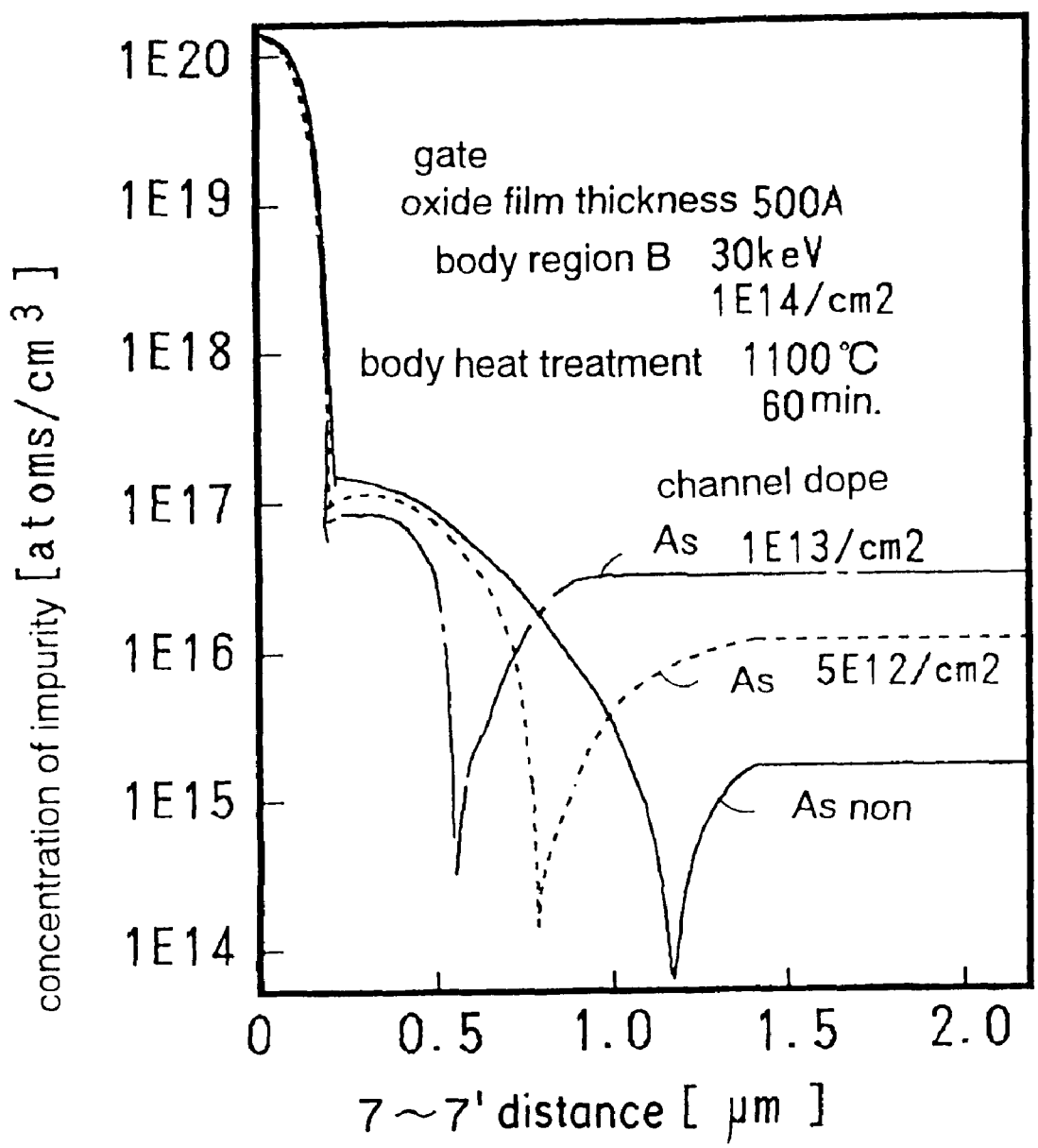
FIG. 7 shows the profile of the concentration of impurities between 7–7' in FIG. 5.

FIG. 7 shows the appearance of the profile of the concentration of impurities between 7–7' in FIG. 5 representative of the section of the LDMOS obtained in the conventional method, using the dose amount of arsenic which is channel doping impurities as a parameter.

In the conventional method, even if arsenic of $1E13/cm^2$ is implanted during the channel doping process, the above-described effect that the concentration of impurities in the source-side high-concentration region within the body region is lowered is small so that the lowered amount of the threshold voltage is only about 0.5 V.

On the other hand, the above-described drift region is influenced by the channel doping impurities implanted at the same time, and the concentration in the drift region becomes higher as the dose amount increases. Simultaneously, because the body region is narrowed more as the dose amount increases, and the channel length is shortened, the off-state drain withstand voltage which is 20 V or higher when the channel doping process is omitted is lowered down to 5 V or less due to punch-through when arsenic of $1E13/cm^2$ is implanted during the channel doping process.

That is, it is found that it is difficult to lower the threshold voltage while the withstand voltage is maintained.

Figure 8:
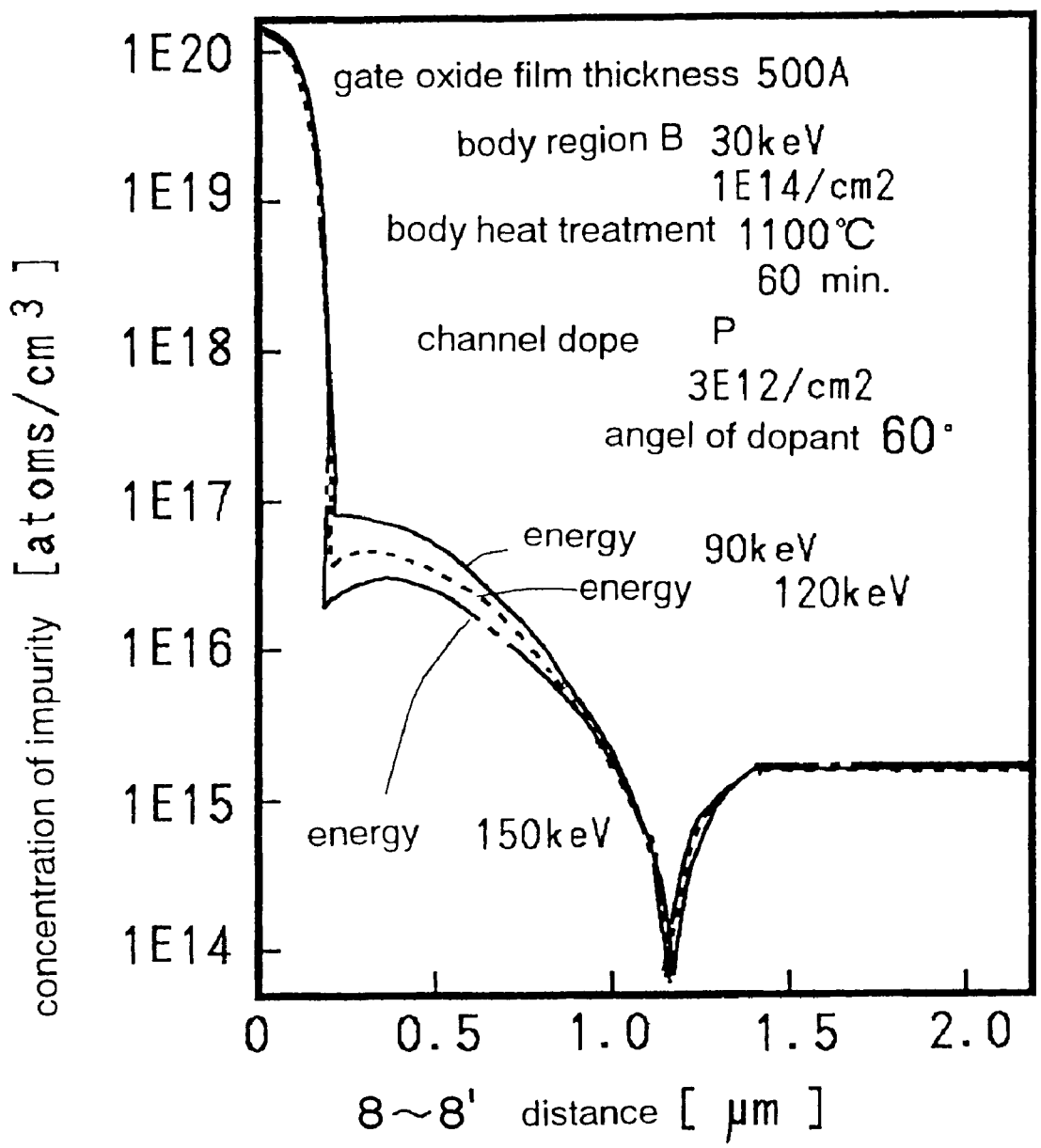
FIG. 8 shows the profile of the concentration of impurities between 8–8' in FIG. 6.

FIG. 8 shows the appearance of the profile of the concentration of impurities between 8–8' in FIG. 6 representative of the section of the LDMOS obtained in the method of the present invention, using the implantation energy of phosphorus which is channel doping impurities as a parameter.

First, no change in the channel length and the concentration in the drift region as in the prior art is found although phosphorus of $3E12/cm^2$ is implanted. For that reason, the withstand voltage is also similar to that in the case where the channel doping process is omitted from the manufacturing method. Also, the concentration of impurities in the source-side high-concentration region within the body region is lowered with an increase in implantation energy. This is because the peak concentration of channel doping approaches the peak in the source-side high-concentration region in the body region with an increase in the implantation energy. Similarly, the peak of the impurity concentration in the body in total moves in a depthwise direction of the substrate accompanying with the increase of the channel doping energy. This effect lowers the threshold voltage by about 1 V.

That is, it is possible to lower the threshold voltage while maintaining the withstand voltage.

In the present invention, the implantation energy of impurities used for channel doping is determined by a desired implantation angle. For example, in the case where the thermal oxide film 10 on the source and the drain are 300 Å in thickness, when phosphorus is implanted into the oxide film, the implantation energy of about 50 keV is required at the implantation angle of 7°. In the present invention, in order to obtain the same implantation depth, the implantation energy needs to be set at a high value such that when the implantation angle of impurities is 30°, the implantation energy is 60 keV, and when the implantation angle of impurities is 60°, the implantation energy is 90 keV. This is because the increased angle makes the implantation depth shallow. The implantation angle can be set freely within 60° due to the limit of an impurity implanting device. Also, when the implantation energy is increased, the amount of implanted impurities is varied. Accordingly, in the case where phosphorus is implanted through the thermal oxide film 300 Å in thickness, arbitrary conditions may be selected within the limits that the channel doping implantation energy ranges from 50 to 180 keV, and the implantation angle ranges from 7° to 60°. In the case where phosphorus of the same dose amount is intended to be implanted deeper toward the drain under the gate electrode, this can be realized by selecting a larger implantation angle and a larger implantation energy within the above limits. In this case, it is desirable that the selection is made within the limits that the implantation angle ranges from 45° to 60°, and the implantation energy ranges from 70 keV to 180 keV.

Also, arsenic may be used instead of phosphorus as the implantation impurities in the channel doping process. Since arsenic is large in mass, when the thermal oxide film on the source and the drain is 300 Å in thickness as described above, it is necessary to set a higher energy than that of phosphorus such that the implantation energy is 110 keV when the implantation angle is 30°, and the implantation energy is 130 keV when the implantation angle is 45°, in order to obtain the same implantation depth. Accordingly, in this case, the implantation conditions may be arbitrarily selected within the limits that the channel doping implantation energy ranges from 90 to 180 keV, and the implantation angle ranges from 7° to 60°, and the conditions are thus more defined than those of phosphorus. In order to implant arsenic more deeply, it is desirable that the implantation angle ranges from 40° to 60°, and the implantation energy ranges from 120 to 180 keV. As described above, in the case where the channel doping impurities of the same dose amount are intended to be implanted more deeply toward the drain under the gate electrode, this can be realized by selecting a larger implantation angle and a larger implantation energy within the above limits. Therefore, in view of this matter, phosphorus is superior to arsenic.

In the case where a larger body region, that is, a longer channel length is required from the viewpoint of the characteristic of the DMOS, phosphorus is advantageous because phosphorus makes it possible to set the long implantation distance with a low energy. On the other hand, since arsenic is less in a variation of the implantation distance than phosphorus, arsenic is advantageous when the short channel length and the control of the threshold voltage with a high accuracy are required. In this way, it is desirable that the dose types of channel doping are selectively used depending on the characteristic of the DMOS.

Also, in the above examples, the n-channel DMOS was described. However, the present invention is also applicable to a p-channel DMOS. In this case, since the body region is formed by the n-type impurities, boron or $BF_2$ is used as the channel doping impurities. When the impurities are implanted deeply in the channel region, it is desirable that the implantation angle ranges from 45° to 60°, and the implantation energy ranges from 40 to 180 keV in case of boron, and the implantation angle ranges from 40° to 60°, and the implantation energy ranges from 100 to 180 keV in case of $BF_2$.

Similarly, in case of the p-channel DMOS, when a large body region, that is, a long channel length is required, boron is advantageous because boron makes it possible to set the long implantation distance with a low energy. On the other hand, since $BF_2$ is less in a variation of the implantation distance than boron, $BF_2$ is used when the short channel length and the control of the threshold voltage with a high accuracy are required. Similarly, in case of the p-channel DMOS, the dose types of channel doping can be selectively used depending on the characteristic of the DMOS.

The method according to the present invention was described with an example in which the body region is formed from the left side of the gate electrode, and channel doping is conducted with an angle from the left side, as shown in FIG. 1. However, the method of the present invention is adaptable to the DMOS in the body region toward various directions from the viewpoint of design.

Figure 9:
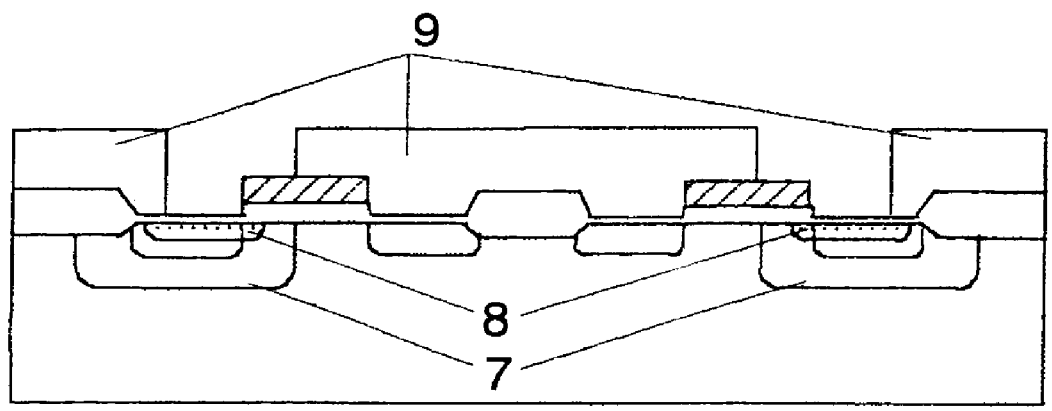
FIG. 9 is a schematic cross-sectional view showing a plurality of lateral type double diffusion insulated gate field effect transistors in accordance with the present invention.

FIG. 9 shows an example where the present invention is applied to a case in which a body region is formed from a direction different from the gate in a plurality of DMOSs formed on the same semiconductor substrate. In this case, the implantation of channel doping impurities into the body formed from all directions during one channel doping process according to the present invention can be realized by rotating a wafer per se during the channel doping process.

Figure 10:
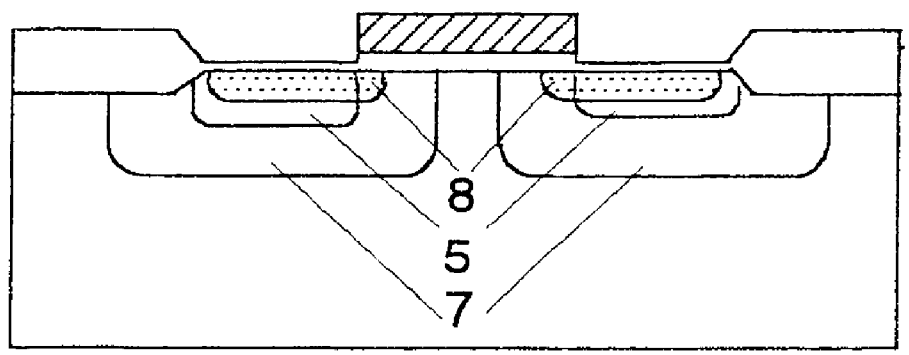
FIG. 10 is a schematic cross-sectional view showing a vertical type double diffusion insulated gate field effect transistors in accordance with the present invention.

Also, as shown in FIG. 10, the present invention is adaptable to not only the LDMOS but also an element such as a VDMOS where a body region and a source region are formed from both sides of the gate electrode although the drain region is not shown.

As described above, the present invention is adaptable to the double diffusion insulated gate field effect transistors of all types. Also, the application of the present invention causes no increase in process.

As described above, the withstand voltage of the DMOS can be prevented from being lowered during the channel doping process by conducting the channel doping process after a heat treatment of the body region, to thereby make it easy to lower the threshold voltage of the DMOS. Therefore, the DMOS can be driven with a low voltage.

According to the present invention, a low-voltage drive can be made without an additional process and without deteriorating the withstand voltage of the DMOS, and the low power consumption of the semiconductor integrated circuit using the DMOS can be realized.

What is claimed is:

1. A method of manufacturing a semiconductor integrated circuit device, comprising the steps of: forming a gate insulating film on a surface of a semiconductor substrate of a first conductivity type; forming a polycrystal silicon film having a thickness of 2000 to 4000 Å on the gate insulating film; implanting impurities in a concentration of $10^{20}$ atoms/$cm^3$ or more into the polycrystal silicon film; etching the polycrystal silicon film to form a gate electrode; etching the gate insulating film where no gate electrode has been formed; forming a thermal oxide film having a thickness of 100 to 300 Å on the semiconductor substrate where the gate insulating film has been etched; implanting impurities of a second conductivity type into a source region of a double diffusion insulated gate field effect transistor in the semiconductor substrate on which the thermal oxide film has been formed to form a body region of the second conductivity type; conducting a heat treatment on the semiconductor substrate at a temperature of 1000° C. or higher; implanting impurities of the first conductivity type into the body region at an inclination angle exceeding 7° with respect to a line perpendicular to the surface of the semiconductor substrate and in a direction from a drain region toward the source region so that the impurities of the first conductivity type are implanted to a depth from the surface of the semiconductor substrate which is less than a depth of the source region from the surface of the semiconductor substrate; implanting impurities of the first conductivity type into the source/drain regions of the double diffusion insulated gate field effect transistor; forming an intermediate insulating film on the thermal oxide film and the polycrystal silicon film; forming contact holes in the intermediate insulating film; and providing metal wirings in the contact holes of the intermediate insulating film.

2. A method of manufacturing a semiconductor integrated circuit device, comprising the steps of: forming a gate insulating film on a surface of a semiconductor substrate of a first conductivity type; forming a polycrystal silicon film having a thickness of 2000 to 4000 Å on the gate insulating film; implanting impurities in a concentration of $10^{20}$ atoms/$cm^3$ or more into the polycrystal silicon film; etching the polycrystal silicon film to form a gate electrode; etching the gate insulating film where no gate electrode has been formed; forming a thermal oxide film having a thickness of 100 to 300 Å on the semiconductor substrate where the gate insulating film has been etched; implanting impurities of a second conductivity type into a source region of a double diffusion insulated gate field effect transistor in the semiconductor substrate on which the thermal oxide film has been formed to form a body region of the second conductivity type; conducting a heat treatment on the semiconductor substrate at a temperature of 1000° C. or higher; implanting impurities of the first conductivity type into the body region at an inclination angle exceeding 7° with respect to a line perpendicular to the surface of the semiconductor substrate while rotating the semiconductor substrate in a planar direction so that the impurities of the first conductivity type are implanted to a depth from the surface of the semiconductor substrate which is less than a depth of the source region from the surface of the semiconductor substrate; implanting impurities of the first conductivity type into the source/drain regions of the double diffusion insulted gate field effect transistor; forming an intermediate insulating film on the thermal oxide film and the polycrystal silicon film; forming contact holes in the intermediate insulating film; and providing metal wirings in the contact holes of the intermediate insulating film.

3. A method of manufacturing a semiconductor integrated circuit device, comprising the steps of: forming a gate insulating film on a surface of an n-type semiconductor substrate; forming a polycrystal silicon film having a thickness of 2000 to 4000 Å on the gate insulating film; implanting impurities in a concentration of $10^{20}$ atoms/$cm^3$ or more into the polycrystal silicon film; etching the polycrystal silicon film to form a gate electrode; etching the gate insulating film where no gate electrode has been formed; forming a thermal oxide film having a thickness of 100 to 300 Å on the semiconductor substrate where the gate insulating film has been etched; implanting p-type impurities into a source region of a double diffusion insulated gate field effect transistor in the semiconductor substrate on which the thermal oxide film has been formed to form a p-type body region; conducting a heat treatment on the semiconductor substrate at a temperature of 1000° C. or higher; implanting phosphorus into the p-type body region at an angle of from 45° to 60° with respect to a line perpendicular to the surface of the semiconductor substrate with an implantation energy of from 70 keV to 180 keV while rotating the semiconductor substrate in a planar direction so that the phosphorus is implanted to a depth from the surface of the semiconductor substrate which is less than a depth of the source region from the surface of the semiconductor substrate; implanting n-type impurities into the source/drain regions of the double diffusion insulated gate field effect transistor; forming an intermediate insulating film on the thermal oxide film and the polycrystal silicon film; forming contact holes in the intermediate insulating film; and providing metal wirings in the contact holes of the intermediate insulating film.

4. A method of manufacturing a semiconductor integrated circuit device, comprising the steps of: forming a gate insulating film on a surface of an n-type semiconductor substrate; forming a polycrystal silicon film having a thickness of 2000 to 4000 Å on the gate insulating film; implanting impurities in a concentration of $10^{20}$ atoms/cm$^3$ or more into the polycrystal silicon film; etching the polycrystal silicon film to form a gate electrode; etching the gate insulating film where no gate electrode has been formed; forming a thermal oxide film having a thickness of 100 to 300 Å on the semiconductor substrate where the gate insulating film has been etched; implanting p-type impurities into a source region of a double diffusion insulated gate field effect transistor in the semiconductor substrate on which the thermal oxide film has been formed to form a p-type body region; conducting a heat treatment on the semiconductor substrate at a temperature of 1000° C. or higher; implanting arsenic into the p-type body region at an angle of from 40° to 60° with respect to a line perpendicular to the surface of the semiconductor substrate with an implantation energy of from 120 keV to 180 keV while rotating the semiconductor substrate in a planar direction so that the arsenic is implanted to a depth from the surface of the semiconductor substrate which is less than a depth of the source region from the surface of the semiconductor substrate; a implanting n-type impurities into the source/drain regions of the double diffusion insulated gate field effect transistor; forming an intermediate insulating film on the thermal oxide film and the polycrystal silicon film; forming contact holes in the intermediate insulating film; and providing metal wirings in the contact holes of the intermediate insulating film.

5. A method of manufacturing a semiconductor integrated circuit device, comprising the steps of: forming a gate insulating film on a surface of a p-type semiconductor substrate; forming a polycrystal silicon film having a thickness of 2000 to 4000 Å on the gate insulating film; implanting impurities with a concentration of $10^{20}$ atoms/cm$^3$ or more into the polycrystal silicon film; etching the polycrystal silicon film to form a gate electrode; etching the gate insulating film where no gate electrode has been formed; forming a thermal oxide film having a thickness of 100 to 300 Å on the semiconductor substrate where the gate insulating film has been etched; implanting n-type impurities into a source region of a double diffusion insulated gate field effect transistor in the semiconductor substrate on which the thermal oxide film has been formed to form an n-type body region; conducting a heat treatment on the semiconductor substrate at a temperature of 1000° C. or higher; implanting boron into the n-type body region at an angle of from 45° to 60° with respect to a line perpendicular to a surface of the semiconductor substrate with an implantation energy of from 40 keV to 180 keV while rotating the semiconductor substrate in a planar direction so that the boron is implanted to a depth from the surface of the semiconductor substrate which is less than a depth of the source region from the surface of the semiconductor substrate; implanting p-type impurities into the source/drain regions of the double diffusion insulated gate field effect transistor; forming an intermediate insulating film on the thermal oxide film and the polycrystal silicon film; forming contact holes in the intermediate insulating film; and providing metal wirings in the contact holes of the intermediate insulating film.

6. A method of manufacturing a semiconductor integrated circuit device, comprising the steps of: forming a gate insulating film on a surface of a p-type semiconductor substrate; forming a polycrystal silicon film having a thickness of 2000 to 4000 Å on the gate insulating film; implanting impurities with a concentration of $10^{20}$ atoms/cm$^3$ or more into the polycrystal silicon film; etching the polycrystal silicon film; etching the polycrystal silicon film to form a gate electrode; etching the gate insulating film where no gate electrode has been formed; forming a thermal oxide film having a thickness of 100 to 300 Å on the semiconductor substrate where the gate insulating film has been etched; implanting n-type impurities into a source region of a double diffusion insulated gate field effect transistor in the semiconductor substrate on which the thermal oxide film has been formed; conducting a heat treatment on the semiconductor substrate at a temperature of 1000° C. or higher; implanting $BF_2$ into the n-type body region at an angle of from 40° to 60° with respect to a line perpendicular to the surface of the semiconductor substrate with an implantation energy of from 100 keV to 180 keV while rotating the semiconductor substrate in a planar direction so that the $BF_2$ is implanted to a depth from the surface of the semiconductor substrate which is less than a depth of the source region from the surface of the semiconductor substrate; implanting p-type impurities into the source/drain regions of the double diffusion insulated gate field effect transistor; forming an intermediate insulating film on the thermal oxide film and the polycrystal silicon film; forming contact holes in the intermediate insulating film; and providing metal wirings in the contact holes intermediate insulating film.

* * * * *